US012703057B2

(12) United States Patent
Lu et al.

(10) Patent No.: US 12,703,057 B2
(45) Date of Patent: Aug. 11, 2026

(54) METHOD FOR DETECTION OF WAFER SLIPPAGE

(71) Applicant: Applied Materials, Inc., Santa Clara, CA (US)

(72) Inventors: Wei Lu, Fremont, CA (US); Yu-Chi Yeh, Mountain View, CA (US); Kun-Yo Lin, Zhubei (TW); Wade Chung, Hsinchu (TW); Harry Q. Lee, Los Altos, CA (US); Nick Huang, Hsinchu (TW); Jianshe Tang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 613 days.

(21) Appl. No.: 18/185,849

(22) Filed: Mar. 17, 2023

(65) Prior Publication Data

US 2024/0308019 A1 Sep. 19, 2024

(51) Int. Cl.
*B24B 37/005* (2012.01)
*B24B 37/04* (2012.01)
(Continued)

(52) U.S. Cl.
CPC ........ *B24B 37/0053* (2013.01); *B24B 37/042* (2013.01); *H10P 52/403* (2026.01);
(Continued)

(58) Field of Classification Search
CPC . B24B 37/005; B24B 37/0053; B24B 37/013; B24B 37/042; B24B 49/105;
(Continued)

(56) References Cited

U.S. PATENT DOCUMENTS 6,707,540 B1 * 3/2004 Lehman ................. G01N 27/72 451/6
2003/0148721 A1 * 8/2003 Birang .................. B24B 49/105 451/550

(Continued)

FOREIGN PATENT DOCUMENTS

CN 106415792 A * 2/2017 ............ H10P 74/238
JP 2010036299 A * 2/2010 ............. B24B 37/04

(Continued)

OTHER PUBLICATIONS

International Search Report and Written Opinion for PCT/US2024/017727 mailed Jun. 20, 2024, 10 pages.

(Continued)

*Primary Examiner* — David L Singer
(74) *Attorney, Agent, or Firm* — Kilpatrick Townsend & Stockton LLP

(57) ABSTRACT

Exemplary methods for detecting substrate slippage include sweeping a first sensor and a second sensor of an in-situ monitoring system across the substrate as the substrate undergoes polishing with a rotatable platen. A first sequence of signal values from the first sensor and a second sequence of signal values from the second sensor include a signal strength relative to the thickness of the layer. For each signal value of at least some of the first sequence of signal values and second sequence of signal values, the method may include determining a first and second position on the substrate respective. The method may also include activating a slippage alert if: the signal strength varies by 30% or more from the first sequence of signal values to the second sequence of signal values, a position on the substrate for the second signal value cannot be determined, or a combination thereof.

12 Claims, 12 Drawing Sheets

(51) Int. Cl.
*H10P 52/40* (2026.01)
*H10P 74/00* (2026.01)
*H10P 74/20* (2026.01)
*B24B 49/10* (2006.01)

(52) U.S. Cl.
CPC .......... *H10P 74/203* (2026.01); *H10P 74/238* (2026.01); *B24B 49/105* (2013.01)

(58) Field of Classification Search
CPC ........ B24B 49/12; H10P 52/00; H10P 52/402; H10P 52/403; H10P 74/203; H10P 74/238
See application file for complete search history.

(56) References Cited

U.S. PATENT DOCUMENTS

2004/0189290 A1* 9/2004 Lehman ................. G01N 27/72 451/8
2004/0259472 A1* 12/2004 Chalmers ................ B24B 49/12 451/6
2005/0136800 A1* 6/2005 Miller ................... B24B 37/013 451/41
2006/0166608 A1* 7/2006 Chalmers ............. B24B 37/013 451/6
2010/0035516 A1* 2/2010 Takahashi ............ B24B 37/013 451/5
2010/0099334 A1 4/2010 Bennett et al.
2011/0269377 A1* 11/2011 Qian ..................... B24B 37/042 451/5
2011/0300775 A1* 12/2011 Zhang ..................... B24B 49/12 451/6
2012/0276661 A1* 11/2012 Iravani .................. H10P 74/207 438/10
2013/0288571 A1* 10/2013 David ................... B24B 37/013 451/5
2014/0027407 A1 1/2014 Deshpande et al.
2014/0127971 A1 5/2014 Xu et al.
2014/0242883 A1* 8/2014 Cherian .................. B24B 49/12 451/6
2015/0118765 A1* 4/2015 Xu ........................ H10P 74/238 438/10
2015/0118766 A1* 4/2015 Xu ........................ B24B 37/013 438/10
2015/0147940 A1* 5/2015 Benvegnu ............... B24B 49/12 451/5
2015/0224623 A1* 8/2015 Xu ........................ B24B 49/105 451/5
2015/0360343 A1* 12/2015 Yavelberg ............... B24B 37/32 438/5
2018/0071889 A1* 3/2018 Huang .................... B24B 37/32
2018/0079048 A1* 3/2018 Shen ..................... B24B 37/013
2018/0079052 A1* 3/2018 Xu ........................ B24B 37/013
2018/0304435 A1* 10/2018 Xu ........................ B24B 37/013
2019/0084119 A1* 3/2019 Lee ........................ B24B 37/013
2019/0286111 A1* 9/2019 Yennie .................. B24B 37/013
2019/0299356 A1* 10/2019 Xu ........................ B24B 37/005
2021/0031331 A1* 2/2021 Trojan ................ B24B 37/0053
2021/0066142 A1* 3/2021 Lau ......................... H10P 74/23
2021/0402551 A1* 12/2021 Xu ........................ B24B 37/013
2022/0281056 A1* 9/2022 Cherian ................ B24B 37/005

FOREIGN PATENT DOCUMENTS

KR 102412776 B1 * 6/2022 ....... H01L 21/30625
WO WO-0146684 A1 * 6/2001 ........... B24B 49/105
WO WO-2006071651 A2 * 7/2006 ............. B24B 49/12

OTHER PUBLICATIONS

Korean Application No. 10-2025-7034114, Office Action mailed on Feb. 19, 2026, 23 pages (10 pages of original document and 13 pages of English Translation).

* cited by examiner 430
402
406
408
404
400
154
See FIG. 2

430
402
406
404
400
154
See FIG. 2

430
410
402
406
400
154
See FIG. 2

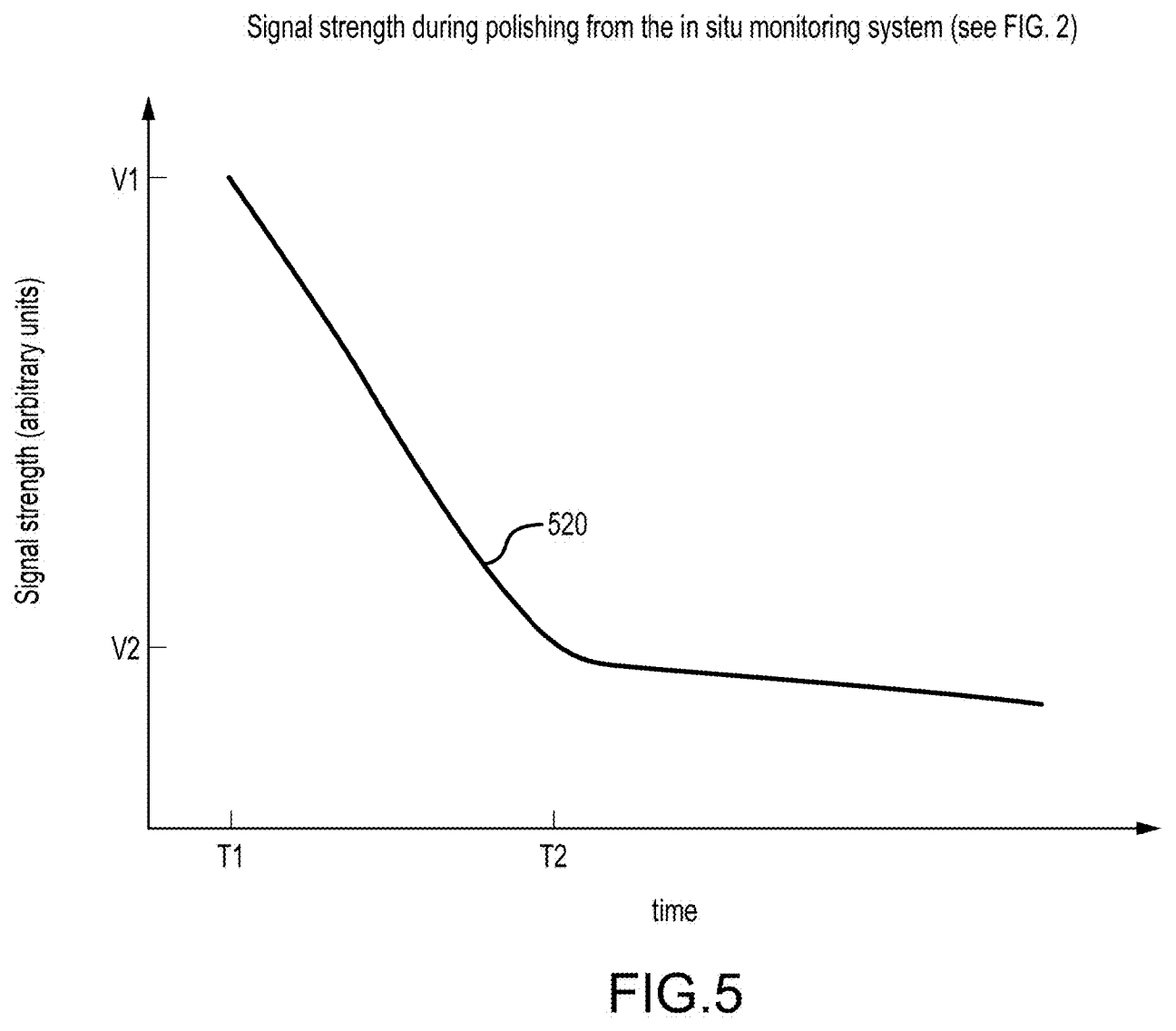

Signal strength during polishing from the in situ monitoring system (see FIG. 2)

Signal strength (arbitrary units)

V1

V2

520

T1

T2 time

FIG.5

First derivative of the signal of 8A

METHOD FOR DETECTION OF WAFER SLIPPAGE

TECHNICAL FIELD

The present technology relates to monitoring of wafer slippage in chemical mechanical polishing. More specifically, the present technology relates to non-optical methods for monitoring wafer slippage during chemical mechanical polishing.

BACKGROUND

An integrated circuit is typically formed on a substrate by the sequential deposition of conductive, semiconductive, or insulative layers on a silicon wafer. A variety of fabrication processes require planarization of a layer on the substrate. For example, one fabrication step involves depositing a conductive filler layer on a patterned insulative layer to fill the trenches or holes in the insulative layer. The filler layer is then polished, also referred to as planarized, until the raised pattern of the insulative layer is exposed. After planarization, the portions of the conductive filler layer remaining between the raised pattern of the insulative layer form vias, plugs, and lines that provide conductive paths between thin film circuits on the substrate. In addition, planarization may be used to planarize a dielectric layer for lithography. However, the necessary liquids and components utilized during planarization often prevent detection of substrate slippage by optical sensors.

Thus, there is a need for improved sensors and methods that can be used to quickly alert substrate slippage events, even when polishing liquids are employed. These and other needs are addressed by the present technology.

SUMMARY

Exemplary methods for detecting substrate slippage include bringing a surface of a layer of a substrate into contact with a polishing pad. The method may include causing relative motion between the substrate and the polishing pad. The method may include sweeping a first sensor and a second sensor of a plurality of sensors of an in-situ monitoring system across the substrate as the layer of the substrate undergoes polishing with a rotatable platen. The method may include generating, from the in-situ monitoring system, a first sequence of signal values from the first sensor and a second sequence of signal values from the second sensor. The first sequence of signal values and the second sequence of signal values include a signal strength relative to the thickness of the layer. The method may include detecting, from the first sequence of signal values from the first sensor, a time that the first sensor traverses a leading edge of the substrate and a time that the first sensor traverses a trailing edge of the substrate. The method may also include detecting, from the second sequence of signal values from the second sensor, a second time that the second sensor traverses a leading edge of the substrate and second time that the second sensor traverses a trailing edge of the substrate. For each signal values of at least some of the first sequence of signal values, the method may include determining a position on the substrate. The first signal value may be based on the time that the first sensor traverses the leading edge of the substrate and the time that the first sensor traverses the trailing edge of the substrate. For each signal value of at least some of the second sequence of signal values, the method may include determining a position on the substrate. The second signal value may be based on the time that the second sensor traverses the leading edge of the substrate and the time that the second sensor traverses the trailing edge of the substrate. The method may also include activating a slippage alert if: the signal strength varies by 30% or more from the first sequence of signal values to the second sequence of signal values, a position on the substrate for the second signal value cannot be determined, or a combination thereof.

In some embodiments, the determination of the position may include determining a first derivative of the first sequence of signal values and identifying a valley and a peak in the first derivative. The method may also include a third sequence of signal values from a third sensor of the plurality of sensors. The third sensor may be disposed between the first sensor and the second sensor. The method may include where the misalignment alert is only activated if the signal strength varies by 30% or more from both the first sequence of signal values to the third sequence of signal values and the third sequence of signal values to the second sequence of signal values, a position on the substrate for the second signal and a third signal value cannot be determined, or a combination thereof. The method may include where the slippage alert halts the relative motion when activated. The method may also include where the relative motion is halted by a controller. In one embodiment, the detecting of the sequence of signal values includes detecting a conductive layer within the leading edge and trailing edge of the substrate.

Exemplary methods for detecting substrate slippage can include bringing a surface of a layer of a substrate into contact with a polishing pad. The method may include causing relative motion between the substrate and the polishing pad. The method may include monitoring the layer of the substrate with an in-situ monitoring system to generate a signal, where the signal strength of the signal depends on a thickness of the layer. The method may include filtering the signal to generate a filtered signal. The method may also include triggering a misalignment alert if a second signal strength value differs from a first signal strength value by 30% or more.

In some embodiments, the method may include an in-situ monitoring system having a plurality of sensors, where the plurality of sensors generate the signal. The method may include where the plurality of sensors are positioned so as to intermittently sweep below the substrate such that at any time, at least one sensor is disposed below the substrate. In one embodiment, the at least a first sensor of the plurality of sensors is disposed in a platen located below the polishing pad. The method may include where the slippage alert halts the relative motion if activated. The method may also include where the relative motion is halted by a controller. The method may include where the plurality of sensors include at least a first sensor, a second sensor, and a third sensor. In some embodiments, the slippage alert is only activated if the signal strength varies by 30% or more from both the first signal strength value to the second signal strength value and the second signal strength value to a third signal strength value.

The present technology may also be directed to an exemplary computer program tangible encoded on a non-transitory computer-readable medium. The computer program may include instructions to cause a computer system to receive a first sequence of signal values from a first sensor of an in-situ monitoring system. The instructions may also cause a second sequence of signal values to be received from a second sensor. The first sequence of signal values and the second sequence of signal values may include a signal strength relative to a thickness of the layer. The first sensor and the second sensor may sweep across and monitor a substrate during polishing. The instructions may cause a computer system to detect, from the first sequence of signal values, a time that the first sensor traverses a leading edge of the substrate and a time that the first sensor traverses a trailing edge of the substrate. The instructions may cause a computer system to detect, from the second sequence of signal values, a time that the second sensor traverses the leading edge of the substrate and a time that the second sensor traverses the trailing edge of the substrate. For each signal value of at least some of the first sequence of signal values, a position may be determined on the substrate based on the time that the first sensor traverses the leading edge of the substrate and the time that the first sensor traverses a trailing edge of the substrate. For each signal value of at least some of the second sequence of signal values, a position may be determined on the substrate based on the time that the second sensor traverses the leading edge of the substrate and the time that the second sensor traverses the trailing edge of the substrate. The instructions may also cause a computer to activate a slippage alert if the signal strength varies by 30% or more from the first sequence of signal values to the second sequence of signal values, a position on the substrate for the second signal value cannot be determined, or a combination thereof.

In some embodiments, the instructions may cause polishing to cease if the slippage alert is activated. The instructions may also include where the computer system automatically ceases the polishing. The instructions may cause a computer system to receive a third sequence of signal values from a third sensor of the in-situ monitoring system. The third sequence of signal values may include a signal strength relative to the thickness of the layer. The third sensor may be disposed circumferentially between the first sensor and the second sensor. In embodiments, the slippage alert may only be activated if the signal strength varies by 30% or more from both the first sequence of signal values to the third sequence of signal values and the third sequence of signal values to the second sequence of signal values, a position on the substrate for the second signal and the third signal value cannot be determined, or a combination thereof. In some embodiments, the instructions to determine the position of the first signal value on the substrate include instructions to determine a distance of a center of a carrier head holding the substrate from an axis of rotation of a rotatable platen. The determination instructions may be based on the time that the first sensor traverses the leading edge and the time that the first sensor traverses the trailing edge. The instructions may also determine the position on the substrate for the first signal value based on the distance.

Such technology may provide numerous benefits over conventional systems and methods. For example, embodiments of the present technology may allow automatic termination of a polishing processes, preventing damage to substrates and polishing systems. Additionally, systems and methods discussed herein can operate in all polishing conditions, and can be utilized to provide necessary redundancy for high-speed and high-quality slippage evaluation. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 5 is an exemplary graph illustrating an idealized signal from an electromagnetic induction monitoring system.

Figure 1:
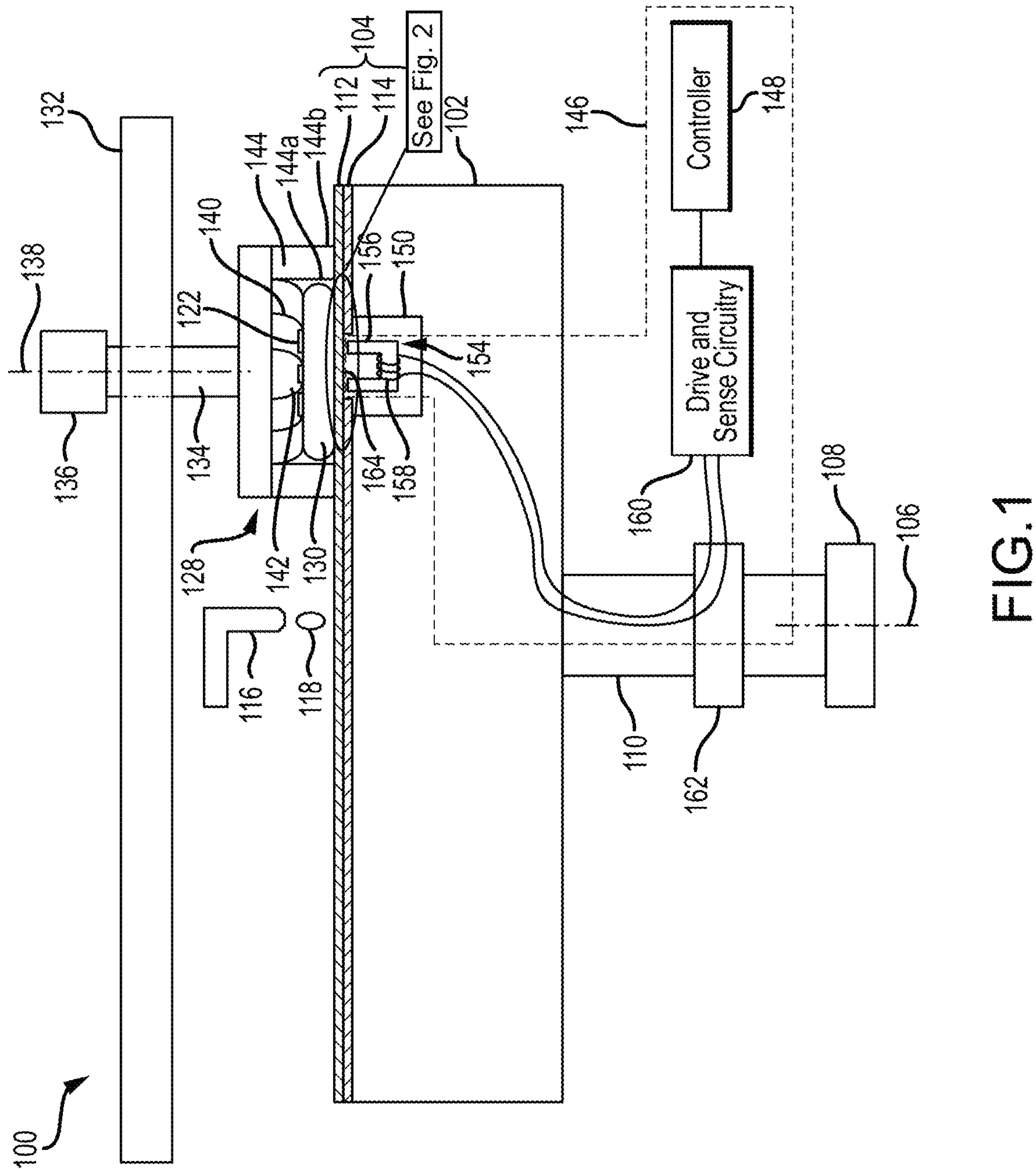
FIG. 1 is a schematic cross-sectional side-view of a chemical mechanical polishing system that includes a current monitoring system.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing may involve the formation and removal of materials to produce any number of structures. During processing, particle generation and contamination may affect interfacial layer compatibility as well as layer formation quality. Chemical-mechanical polishing or any other type of polishing or removal may be performed to produce relatively planar surfaces, such as within system tolerances. Chemical-mechanical polishing (CMP), among other processing operations, is commonly used in semiconductor processing to planarize or polish layers of material formed over a semiconductor substrate. Conventional CMP polishing involves a substrate being positioned face down on a polishing pad, with a carrier that holds the substrate against a rotating polishing pad. Generally, a polishing liquid, such as slurry with abrasive particles, is supplied to the surface of the polishing pad during rotation. Material formed along the substrate is removed through a combination of chemical interaction of the polishing slurry and mechanical interaction with the polishing pad.

As may be apparent from the above, the substrate is not physically attached to the polishing pad or the carrier head during CMP planarization. The substrate instead relies upon adequate force between the polishing pad and the carrier head to maintain the substrate in the proper position during polishing. If processing conditions are not correct, or if sudden changes are made, substrates can slip, or be pushed out from the polishing head. Currently, slippage (e.g., the undesired movement of the substrate at least partially, or fully, out from under a carrier head) is detected utilizing optical sensors. However, optical sensors mounted to the carrier head alone have proven insufficient for in-situ monitoring. For instance, due to component orientation, optical sensors may only be mounted on a trailing edge of the carrier head. Thus, if slippage occurs elsewhere around the carrier head, the slippage will not be detected. Similarly, optical sensors detect slippage based upon light reflection from the substrate. However, polishing liquids, and particularly opaque polishing slurries, can cover the upper surface of the slipped substrate, impeding optical detection.

The present technology overcomes these challenges for quickly and accurately detecting substrate slippage from under the carrier. Namely, the present technology utilizes a unique array of electro-magnetic sensors disposed in the platen. By utilizing such an array, substrate thickness, edge detection, or both may automatically register substrate slippage. The detection methods used with such electro-magnetic sensors are very sensitive, even in situations where polishing liquids or polishing components would interfere with optical sensors. In addition, electro-magnetic detection methods may register a slippage event in a very short period of time, such as even less than one polishing rotation. Such short alert periods may provide additional advantages, as continued polishing after slippage can damage the wafer, the polishing head, or a combination thereof.

Although the remaining disclosure will routinely identify specific film polishing processes utilizing the disclosed technology, it will be readily understood that the systems and methods are equally applicable to a variety of other semiconductor processing operations and systems. Accordingly, the technology should not be considered to be so limited as for use with the described polishing systems or processes alone. The disclosure will discuss one possible system that can be used with the present technology before describing systems and methods or operations of exemplary process sequences according to some embodiments of the present technology. It is to be understood that the technology is not limited to the equipment described, and processes discussed may be performed in any number of processing chambers and systems, along with any number of modifications, some of which will be noted below.

FIG. 1 illustrates an example of a polishing system 100 of a chemical mechanical polishing apparatus. The polishing system 100 includes a rotatable disk-shaped platen 102 on which a polishing pad 104 is situated. The platen 102 is operable to rotate about its central axis 106. For example, a motor 108 can turn a drive shaft 110 to rotate the platen 102. The polishing pad 104 can be a two-layer polishing pad with an outer layer 112 and a softer backing layer 114. The polishing system 100 can include a supply port or a combined supply-rinse arm 116 to dispense a polishing liquid 118, such as slurry, onto the polishing pad 104.

The carrier head 128 is operable to hold a substrate 130 against the polishing pad 104. The carrier head 128 is suspended from a support structure 132, e.g., a carousel or a track, and is connected by a drive shaft 134 to a carrier head rotation motor 136 so that the carrier head can rotate about an axis 138. Optionally, the carrier head 128 can oscillate laterally, e.g., on sliders on the carousel or track 132; or by rotational oscillation of the carousel itself. In operation, the platen 102 is rotated about its central axis 106, and the carrier head 128 is rotated about its central axis 138 and translated laterally across the top surface of the polishing pad 104. Where there are multiple carrier heads, each carrier head 128 can have independent control of its polishing parameters, for example each carrier head can independently control the pressure applied to each respective substrate. The carrier head 128 can include a flexible membrane 140 having a substrate mounting surface to contact the back side of the substrate 130, and a plurality of pressurizable chambers 142 to apply different pressures to different zones, e.g., different radial zones, on the substrate 130. The carrier head can also include a retaining ring 144 to hold the substrate.

In some implementations, the polishing system 100 includes an in-situ monitoring system 146 that generates a signal that represents the thickness of one or more layer(s) on the substrate 130 that is being polished. For example, the in-situ monitoring system 146 could be an optical monitoring system, e.g., a spectrographic monitoring system, or an eddy current monitoring system. However, as noted above, in some embodiments, the monitoring system 146 discussed herein is an electro-magnetic current monitoring system. The in-situ monitoring system 146 can be coupled to a controller 148, which can detect a polishing endpoint, adjust polishing parameters to reduce polishing non-uniformity based on the measurements, or detect substrate 130 slippage. At least some sensor components of the in-situ monitoring system 146 (discussed in greater detail below) can be located in a recess 150 formed in the platen 102.

The polishing system 100 includes an in-situ monitoring system 146 that generates a signal that represents a thickness of one or more polishing system 100 components. In particular, the in-situ monitoring system 146 can be an electromagnetic induction monitoring system. The electromagnetic induction monitoring system can operate either by generation of eddy-current in a conductive layer or generation of current in a conductive loop. In operation, the polishing system 100 can use the monitoring system 146 to determine thickness of one or more polishing system 100 components (e.g., one or more layers of a substrate 130).

The monitoring system 146 can include a sensor 154 installed in a recess 150 in the platen 102. The sensor 154 can include a magnetic core 156 positioned at least partially in the recess 150, and at least one coil 158 wound around the magnetic core 156. Drive and sense circuitry 160 is electrically connected to the coil 158. The drive and sense circuitry 160 generates a signal that can be sent to a controller 148. Although illustrated as outside the platen 102, some or all of the drive and sense circuitry 160 can be installed in the platen 102. A rotary coupler 162 can be used to electrically connect components in the rotatable platen 102, e.g., the coil 158, to components outside the platen 102, e.g., the drive and sense circuitry 160.

Optionally, a recess 164 can be formed in the bottom of the polishing pad 104 overlying the recess 150. Optionally, a portion of the magnetic core 156 can project into the recess 164. Assuming that the polishing pad 104 is a two-layer pad, the recess 164 can be constructed by removing a portion of the backing layer 114, or by removing both the backing layer 114 and a portion of the polishing layer 112. Alternatively, the polishing pad can lack such a recess; in this case the magnetic core 156 of the sensor 154 does not project above the top of the platen 102. The in-situ monitoring system 146 may include just one sensor 154 (see, e.g., FIG. 1).

Figure 2:
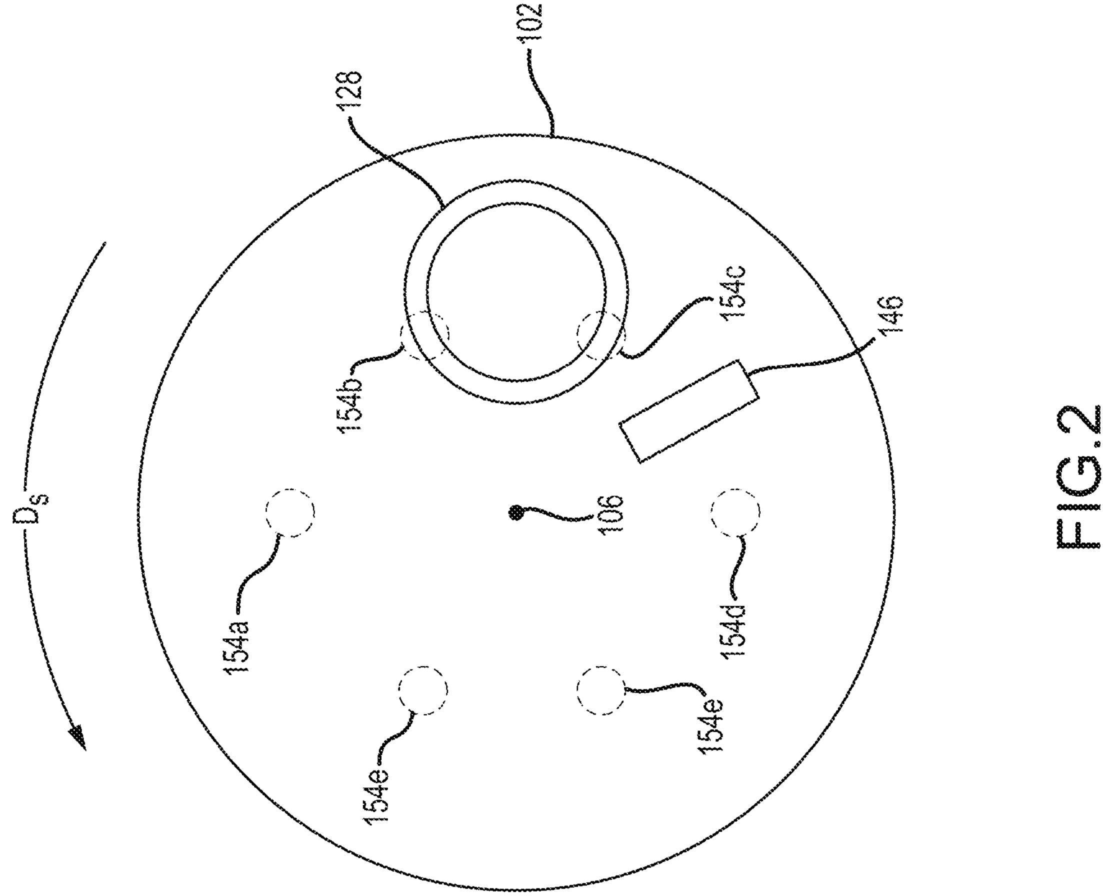
FIG. 2 is schematic top view of a chemical mechanical polishing system.

Alternatively, as shown more clearly in FIG. 2, the in-situ monitoring system 146 (shown in FIG. 1) could include a plurality of sensors 154, illustrated as 154*a*-154*f*, installed in, on, or under, the platen 102. While six sensors are illustrated, it should be clear that the plurality of sensors 154 can include, one, two, three, four, five, six, seven, eight, nine, ten, or even more sensors in some embodiments. As will be discussed in greater detail below, the number of sensors 154 may be selected based upon the size of the platen, the size of the substrate, or a combination thereof, in order to maintain constant monitoring of the substrate 130. Namely, as illustrated in FIG. 2, the number of sensors and spacing therebetween may be selected such that at least one sensor 154 is always disposed beneath substrate 130. By utilizing such an arrangement, detection of a slippage event may be detected and alerted in one fully platen rotation or less, such as where 5 sensors or less have swept below carrier head 128, such as about 4 sensors or less, such as even about 3 sensors or less. Namely, in some aspects, an alert may be triggered after a first sensor notes a thickness or edge detection inconsistency, and it is confirmed by two, or even only one, additional sensor(s).

The sensors 154 may be positioned at equal angular intervals around the central axis 106. The sensors 154 can be positioned equidistant around central axis 106, or the sensors 154 could be at different distances from the central axis 106. Providing multiple sensors 154 can increase the rate of collection of data. The controller 148 can include a demultiplexing function in software to select an appropriate signal (e.g., select each sensor as it travels below the substrate 130), or de-multiplexing could be provided by a hardware component. In some embodiments, each sensor 154 can be positioned in a separate recess 150 for the in-situ monitoring system 146. Alternatively, each sensor 154 of the plurality of sensors 154 may be located in the same recess 150, such as when a circular cross-sectional recess extends through platen 102 below polishing pad 104.

Nonetheless, as illustrated, carrier head 128 disposed above substrate 130 (shown in FIG. 1), presses substrate 130 against polishing pad 104 (FIG. 1), disposed on platen 102. Carrier head 128 may be turning in a clockwise or counterclockwise direction as discussed above. Additionally or alternatively, platen 102 is turning about central axis 106. In the illustrated embodiment, the platen 102 is turning in a counterclockwise fashion. However, it should be understood that the platen 102 may turn in either a clockwise or counterclockwise direction, as the sensor orientation does not need to be adjusted unlike optical detection methods.

Furthermore, in some embodiments, platen 102 and carrier head 128 may be turning in the same direction, or in opposite directions.

In some embodiments, the platen 102 and sensors 154*a-f* may be shaped and sized such that the substrate 130 is disposed over at least one sensor 154, such as at least two sensors 154 of the plurality of sensors 154*a-f*. The disposition of the substrate 130 over one or more sensors 154 may occur at all times during the rotation of platen 102. For instance, as platen 102 rotates, sensor 154*c* may move towards the location of sensor 154*b*, while sensor 154*d* moves towards the location of sensor 154*c* and so forth. However, as noted above, in some embodiments, only one sensor 154 may be located under substrate 130 at any point in rotation of platen 102. Thus, as will be discussed in greater detail below, due to the continuous contact, an in-situ monitoring alert may be received very quickly, as two or more sensors can quickly report and verify substrate 130 slippage.

Figure 3:
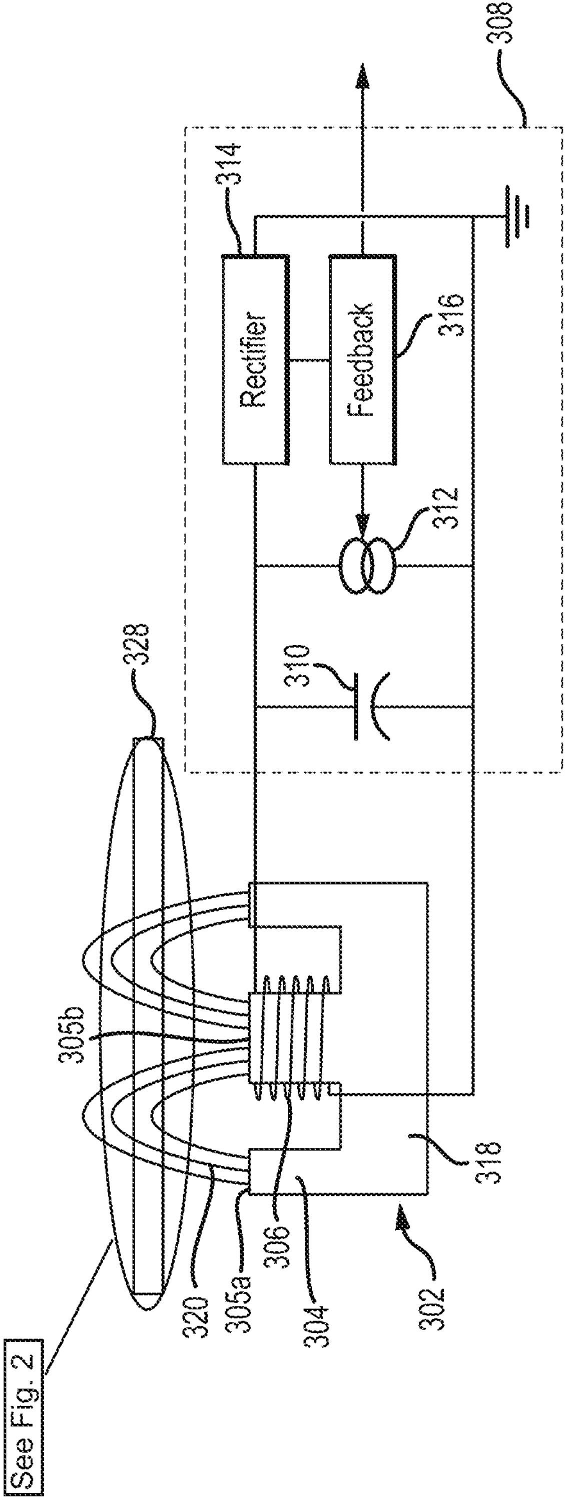
FIG. 3 is a schematic circuit diagram of a drive system for an electromagnetic induction monitoring system.

Referring to FIG. 3, in some embodiments, sensors 154 may operate via an electromagnetic field 320. Namely, circuitry 308 applies an AC current to the coil 306, which generates a magnetic field 320 between two poles 305*a* and 305*b* of magnetic core 304. In operation, a portion of the magnetic field 320 may extend through the polishing pad 104 (see, FIG. 1). The magnetic core 156 can include two, three, four, or more, prongs 305 extending in parallel from a core backing 318. Implementations with only one prong (and no core backing) are also possible.

FIG. 3 illustrates an example of the drive and sense circuitry 308. The circuitry 308 includes a capacitor 310 connected in parallel with the coil 306. Together the coil 306 and the capacitor 310 can form an LC resonant tank. In operation, a current generator 312 (e.g., a current generator based on a marginal oscillator circuit) drives the system at the resonant frequency of the LC tank circuit formed by the coil 306 (with inductance L) and the capacitor 310 (with capacitance C). The configuration of coil 306, core 304 and drive and sense circuitry 308 can have a resonant frequency of about 10 kHz to 100 MHz, e.g., 10 kHz to 300 kHz. The current generator 312 can be designed to maintain the peak-to-peak amplitude of the sinusoidal oscillation at a constant value. A time-dependent voltage with amplitude $V_0$ is rectified using a rectifier 314 and provided to a feedback circuit 316. The feedback circuit 316 determines a drive current for current generator 312 to keep the amplitude of the voltage $V_0$ constant.

As noted above, as the platen 102 rotates, one or more sensors 154 sweeps below the carrier head 128 and substrate 130. By sampling the signal from the circuitry 308 at a particular frequency, the circuitry 308 generates measurements at one or more locations across the substrate 130. For each sweep, measurements at one or more of the locations can be selected or combined. When the magnetic field 320 reaches the substrate 130, the magnetic field 320 may pass through and generate an eddy-current in one or more conductive layers of the substrate 130 or may generate a current in a conductive loop. This creates an effective impedance, thus increasing the drive current required for the current generator 302 to keep the amplitude of the voltage $V_0$ constant. The magnitude of the effective impedance depends on the distance between the sensor 154 and at least one conductive layer of substrate 130. This distance depends on the thickness of substrate 130 and the thickness of the polishing pad 104, and more particularly, the distance between one or more of the conductive layers of substrate 130 and the respective sensor 154. Thus, the drive current generated by the current generator 312 provides a measurement of the thickness of the substrate 130. More particularly, the monitoring system 146 can be used to monitor the thickness of one or more conductive layer(s) (e.g., one or more conductive layer(s) of substrate 130), by inducing eddy currents in a conductive layer or generating a current in a conductive loop at the conductive layer. Alternatively, the monitoring system 146 can be used to monitor the thickness of a dielectric layer of substrate 130, e.g., by inducing eddy currents or current in a conductive layer or loop around target 328 (122 in FIG. 1), respectively, attached to the substrate mounting surface.

If monitoring of the thickness of a conductive layer on the substrate is desired, then when the magnetic field 320 reaches the conductive layer of substrate 130, the magnetic field 320 can pass through and generate a current (if a conductive loop is formed in the layer) or create an eddy-current (if the conductive feature is a continuous body such as a sheet). This creates an effective impedance, thus increasing the drive current required for the current generator 312 to keep the amplitude of the voltage $V_0$ constant. The magnitude of the effective impedance depends on the thickness of the conductive layer(s). Thus, the drive current generated by the current generator 312 provides a measurement of the thickness of the conductive layer being polished.

As noted above, if monitoring of the thickness of a dielectric layer on the substrate is desired, then a conductive target 328 can located on the far side of the substrate 130 from the dielectric layer being polished (e.g., between substrate 130 and carrier head 128, shown as 122 in FIG. 1). When the magnetic field 320 reaches the conductive target, the magnetic field 320 can pass through and generate a current (if the target is a loop) or create an eddy-current (if the target is a sheet). This creates an effective impedance, thus increasing the drive current required for the current generator 312 to keep the amplitude of the voltage $V_0$ constant. The magnitude of the effective impedance depends on the distance between the sensor 154 and the target 328, which depends on the thickness of the dielectric layer being polished on a pad with a consistent thickness. Thus, the drive current generated by the current generator 312 provides a measurement of the thickness of the dielectric layer being polished.

Other configurations are possible for the drive and sense circuitry 308. For example, separate drive and sense coils could be wound around the core, the drive coil could be driven at a constant frequency, and the amplitude or phase (relative to the driving oscillator) of the current from the sense coil could be used for a signal that provides a measurement of the thickness of substrate 130.

A controller 148, e.g., a general purpose programmable digital computer, receives the sequence of values from the in-situ monitoring system 146. Since the sensor 154 sweeps beneath the substrate 130 with each rotation of the platen 102, information on the depth of the substrate 130 or even individual substrate layers (e.g., one or more conductive layers disposed in horizontal layers along substrate 130) is accumulated in-situ (once per platen rotation). The controller 148 can be programmed to sample measurements from the monitoring system 146 when the substrate 130 generally overlies the recessed section(s) 164. As polishing progresses, the thickness of the substrate 130 and/or individual layers thereof, changes, and the sampled signals vary with time. The measurements from the monitoring system can be displayed on an output device during polishing to permit the operator of the device to visually monitor the progress of the polishing operation.

Figures 4A, 4B, 4C:
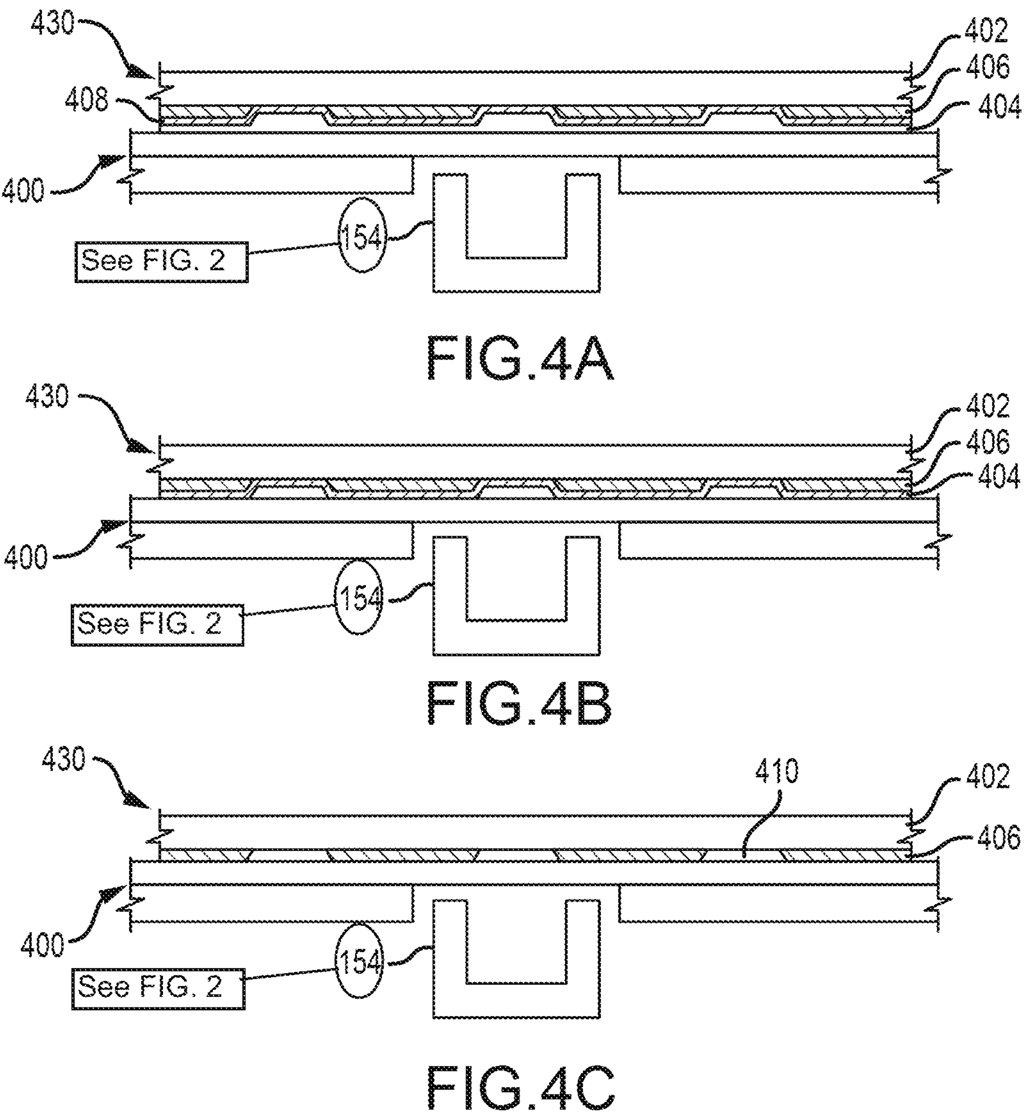
FIGS. 4A to 4C illustrate a schematic illustration of a substrate polishing progression.

FIGS. 4A-4C illustrate a process of polishing a conductive layer. In addition, FIG. 5 is an exemplary graph illustrating a signal 520 from the in-situ monitoring system 146. The signal 520 is illustrated in FIG. 5 in an idealized form; the raw signal would include significant noise.

Initially, as shown in FIG. 4A, for a polishing operation, the substrate 430 is placed in contact with the polishing pad 400. The substrate 430 can include a silicon wafer 402 and a conductive layer 404, e.g., a metal such as copper, aluminum, cobalt, titanium, or titanium nitride disposed over one or more patterned underlying layers 406, which can be semiconductor, conductor or insulator layers. A barrier layer 408, such as tantalum or tantalum nitride, may separate the metal layer from the underlying dielectric. The patterned underlying layers 406 can include metal features, e.g., trenches, vias, pads and interconnects of copper, aluminum, or tungsten. In addition, as noted above, and while not shown, each substrate 430 can include multiple conductive layers 404 separated by patterned underlying layers 406 and/or barrier layers 408.

Since, prior to polishing, the bulk of the conductive layer 404 is initially relatively thick and continuous, it has a low resistance, and relatively strong eddy currents can be generated in the conductive layer. The eddy currents cause the metal layer to function as an impedance source in parallel with the capacitor 310. For example, the signal can start at an initial value $V_1$ at time $T_1$ (see FIG. 5). In embodiments, the initial time may be a time zero, or a start of the consideration for slippage detection. Thus, in embodiments, the method may instead refer to a first signal strength value at a first time, where the first signal strength value can be measured at any time it is desired to begin detection of wafer slippage.

Referring to FIG. 4B, as the substrate 430 is polished the bulk portion of the conductive layer 404 is thinned. As the conductive layer 404 thins, its sheet resistance increases, and the eddy currents in the metal layer become dampened. Consequently, the coupling between the conductive layer 404 and sensor circuitry is reduced (i.e., increasing the resistance of the virtual impedance source). In some implementations of the sensor circuitry 308, this can cause the signal to fall from the initial value $V_1$.

Referring to FIG. 4C, eventually the bulk portion of the conductive layer 404 is removed, leaving conductive interconnects 410 in the trenches between the patterned insulative layer 406. At this point, the coupling between the conductive portions in the substrate, which are generally small and generally non-continuous, and the signal from the sensor circuitry tends to plateau (although it may continue to fall as the trench depth is reduced). This causes a noticeable decrease in the rate of change in amplitude of the output signal from the sensor circuit. As shown in FIG. 5, this occurs at time $T_2$ when the signal reaches value $V_2$.

Returning to FIG. 1, if the goal is to halt polishing when the underlying layer is exposed, then the value $V_2$ (see FIG. 5) could be used as the threshold value for endpoint detection. However, as noted above the signal from the in-situ monitoring system 146 can include noise. Therefore, a filter can be applied to the raw signal from the in-situ monitoring system 146. For example, the controller 148 can apply a filter, e.g., a notch-filter or a running-average filter to the signal received from the in-situ monitoring system 146 to generate a filtered signal. Other kinds of filters can be applied, e.g., a band-pass filter, a low-pass filter, a high-pass filter, an integrated filter, or a median filter. The filtered signal can then be used for endpoint determination.

Figures 6, 7:
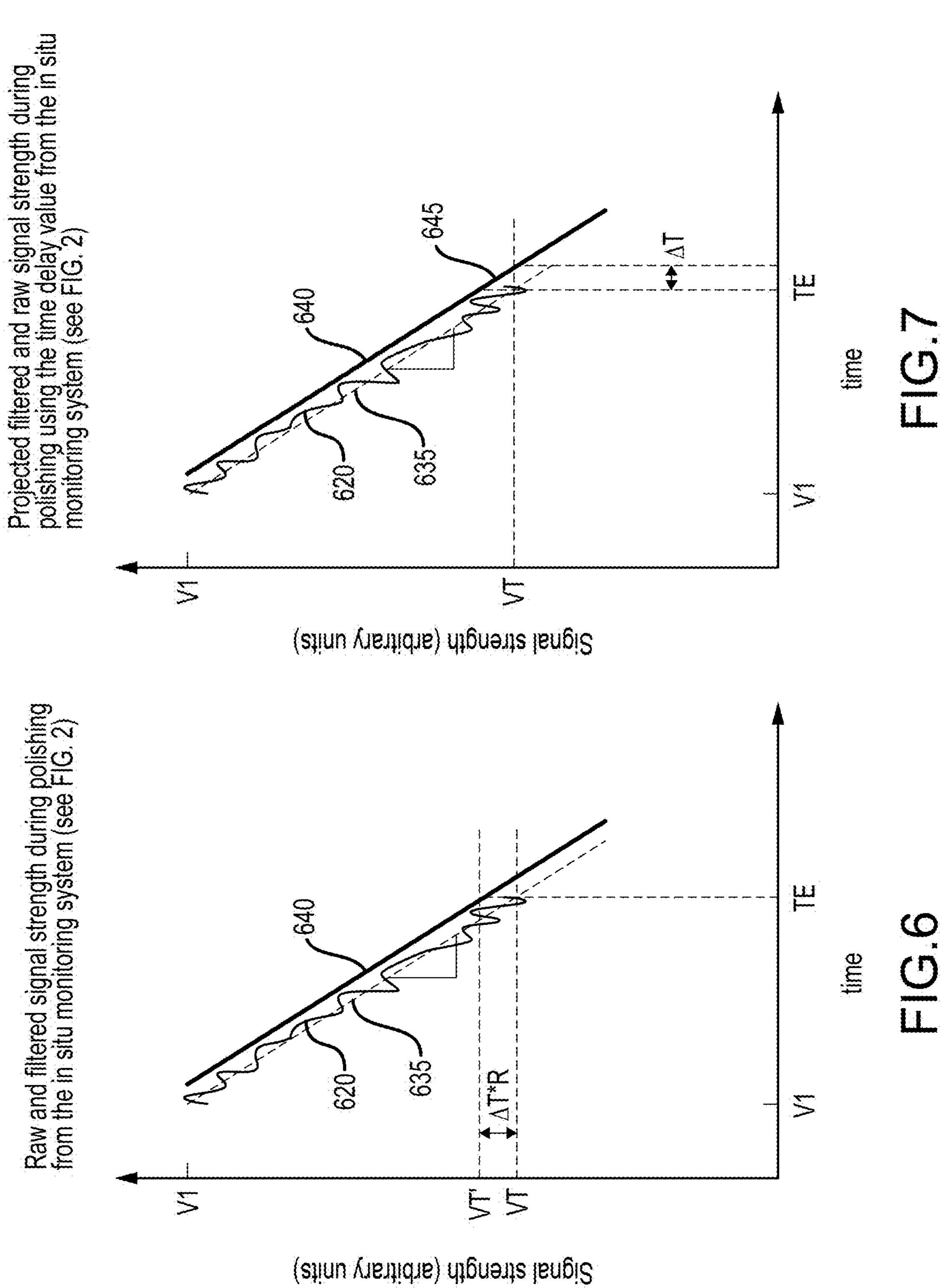
FIG. 6 is an exemplary graph illustrating a raw signal and a filtered signal from an electromagnetic induction monitoring system.
FIG. 7 is an exemplary graph illustrating a raw signal and a filtered signal from an electromagnetic induction monitoring system.
Figure 8A:
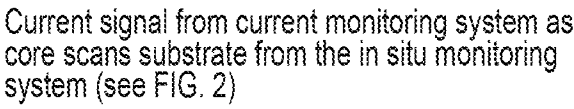
FIG. 8A illustrates a graph of a signal from a current monitoring system as the core scans across the substrate.
Figure 8A:
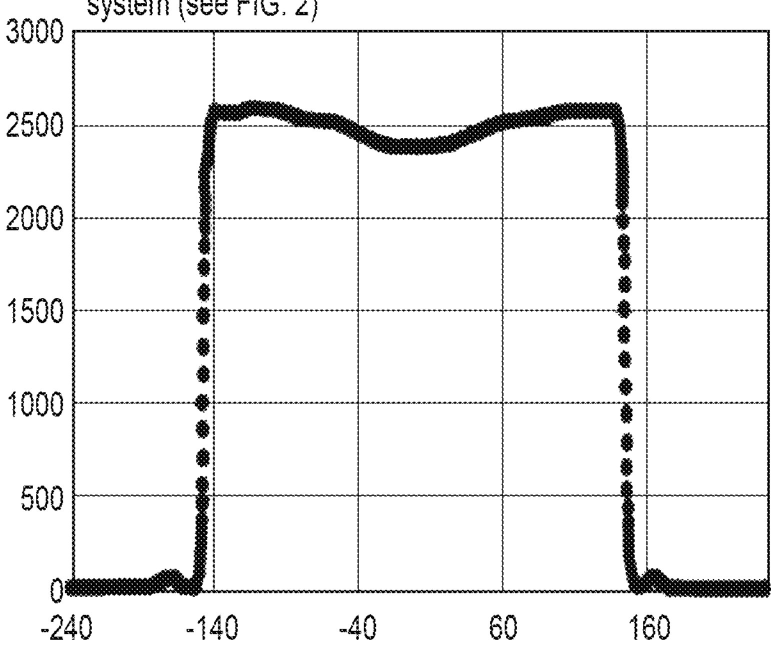
Figure 8B:
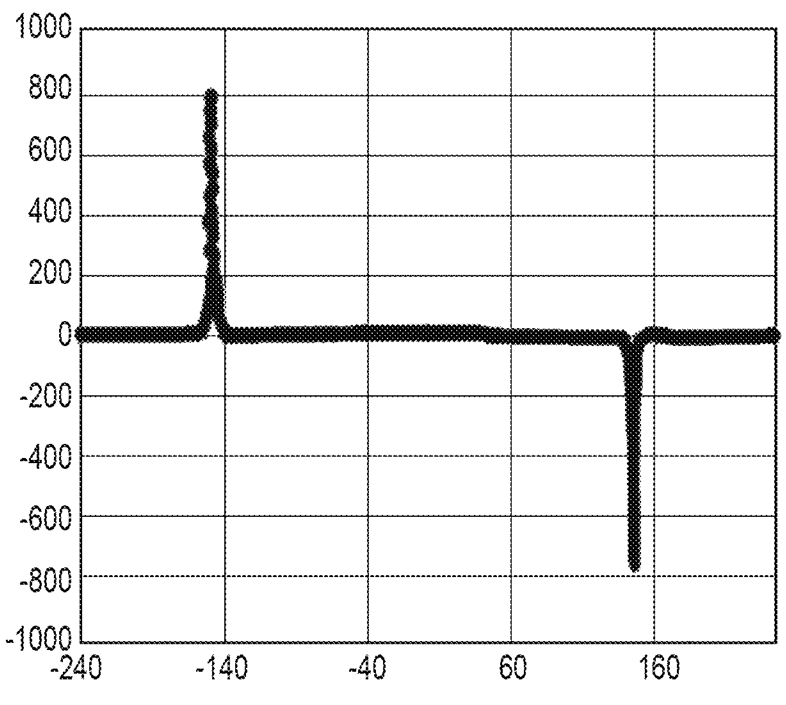
FIG. 8B illustrates a graph of the first derivative of the signal.
Figure 8C:
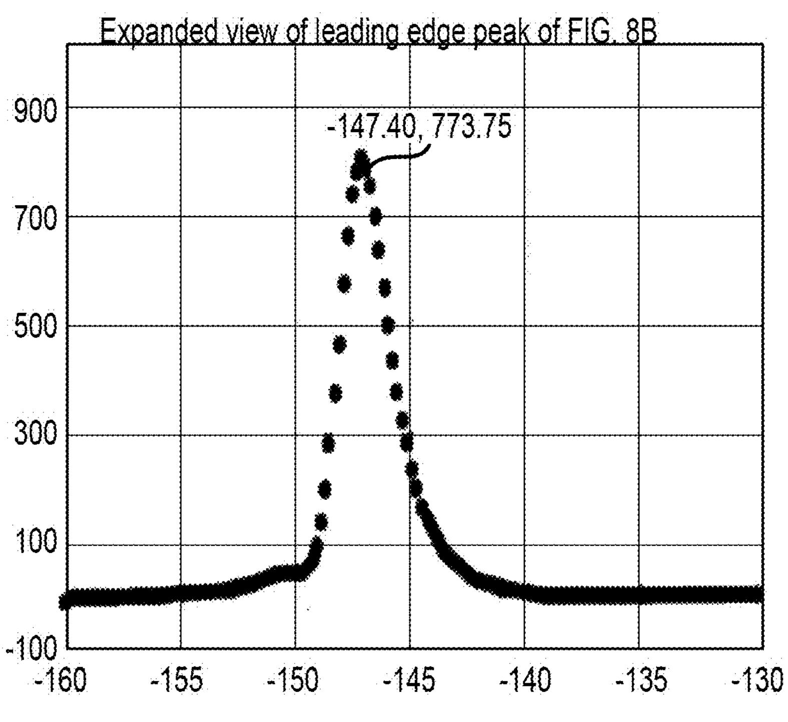
FIG. 8C illustrates an expanded view of the first derivative of a portion of the signal from the leading edge of the substrate.
Figure 8D:
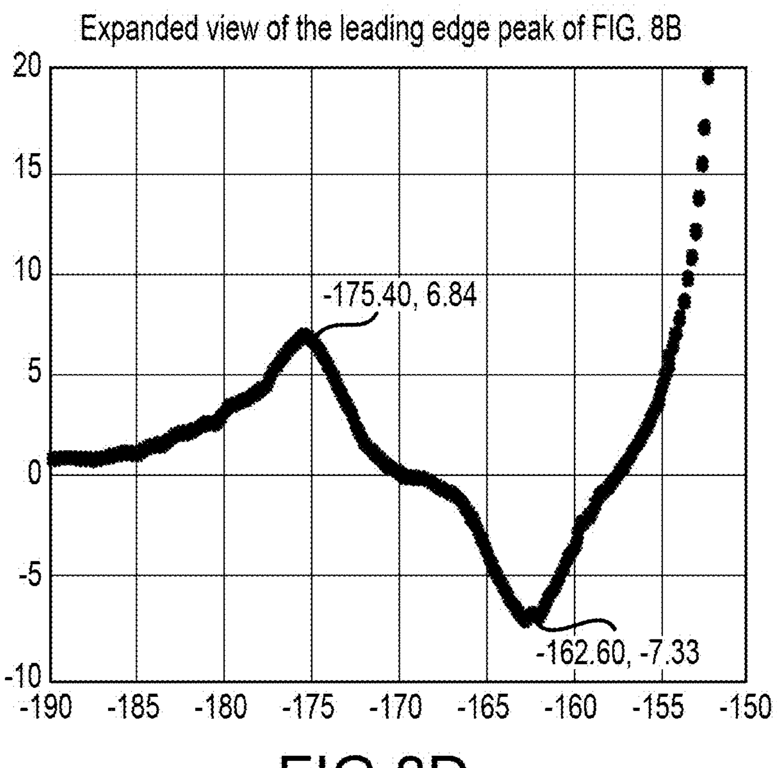
FIG. 8D illustrates an expanded view of the first derivative of a portion of the signal from the leading edge of the retaining ring.
Figure 8E:
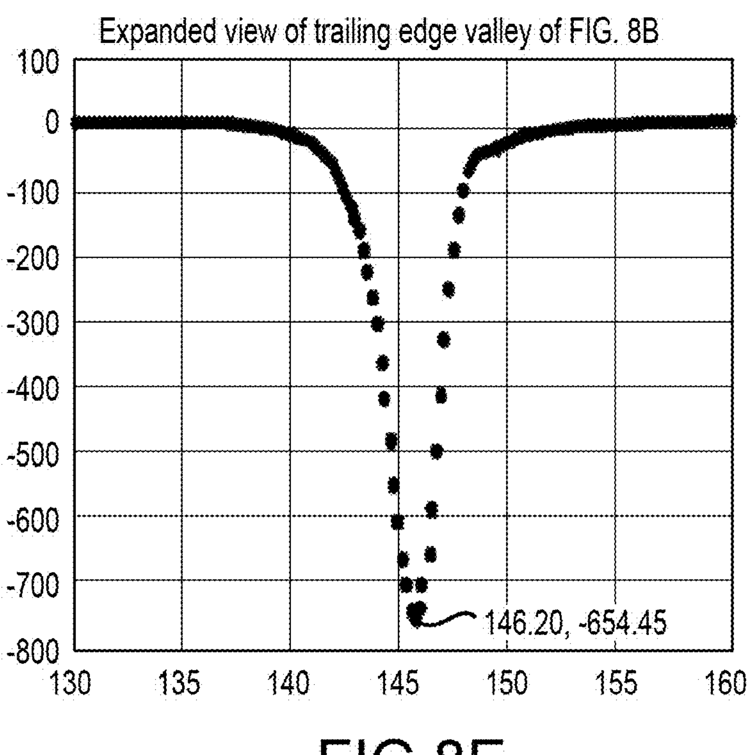
FIG. 8E illustrates an expanded view of the first derivative of a portion of the signal from the trailing edge of the wafer.
Figure 8F:
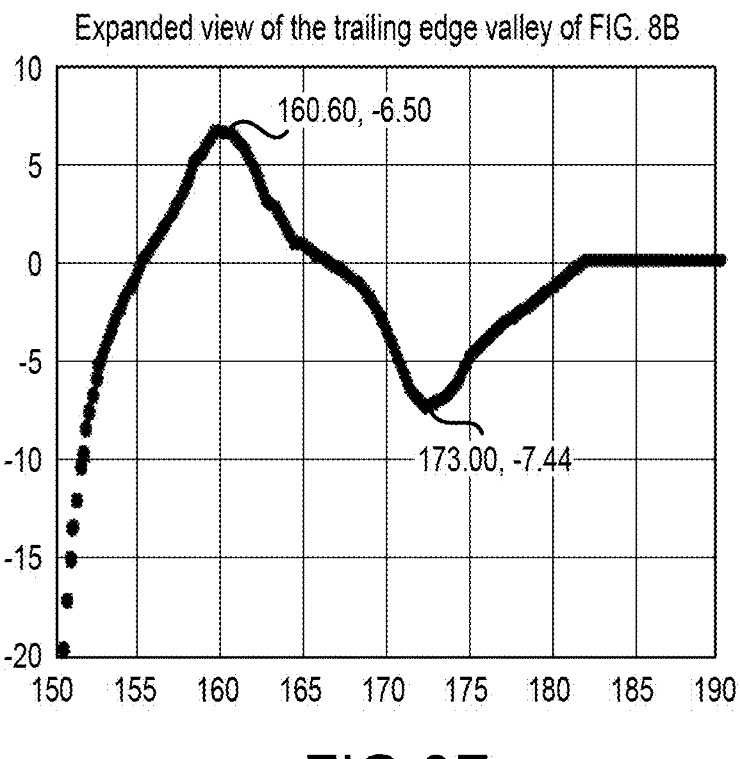
FIG. 8F illustrates an expanded view of the first derivative of a portion of the signal from the trailing edge of the retaining ring.

FIG. 6 is an exemplary graph illustrating signals used by the in-situ monitoring system 146. Referring to FIGS. 1 and 6, the sensor 154 can generate a "raw" signal 620. Although illustrated in FIG. 6 as a continuous line, in reality the raw signal 620 is a sequence of discrete values. The measurements can be acquired at a set frequency. For example, if the sensor 154 passes below the substrate 130 once per revolution of the platen 102, then the measurement frequency can be equal to the platen rotation rate. However, each graph can be for a single sensor 154, each sensors 154*a-f* may produce a signal 620, or the signal from multiple sensors 154*a-f* can be normalized for a single output signal 620.

As illustrated in FIG. 6, this signal 620 can include significant noise, so the controller 148 applies a filter the signal 620 to generate a filtered signal 640. Again, although illustrated as a continuous line, in reality the filtered signal 640 can be a sequence of discrete values, with each value in the sequence calculated from a combination of multiple values from the raw signal. In some implementations, the filtered signal 640 is generated by fitting a function, e.g., a polynomial function, e.g., a first or second order polynomial function, to the sequence of values.

As noted above, due to the need to acquire signal values after the nominal measurement time, generation of the filtered value is delayed. For example, assuming substrate 130 asymmetry is small, and measurements are taken at a regular frequency, if the filter operates by generating an output value that is a running average of five consecutive values from the raw signal, then a given output value would more accurately represent a measurement at the time of the third value from the raw signal rather than at the time of the fifth value from the raw signal. This is represented in FIG. 6 by the filtered signal 640 being shifted to the right relative to phantom line 635 (which represents a hypothetical filtered signal generated without a time offset caused by the delay).

To compensate for the time needed by the filter to acquire data, the nominal threshold value can be adjusted. In particular, the controller 148 can store a time delay value ΔT that represents the time offset generated by the filter. The controller 148 can also determine a slope R of the filtered signal 640. This slope R can represent the current polishing rate. Where VT is the original threshold (e.g., $V_2$ from FIG. 5), an adjusted threshold VT' can be calculated as $$VT' = VT = (\Delta T * R)$$

Endpoint can then be triggered by the controller at the time TE when the filtered signal 640 crosses the adjusted threshold VT'.

Alternatively, as shown in FIG. 7, it may be possible to project the filtered signal 640 forward by an amount of time equal to the time delay value ΔT to generate a projected signal 645. Endpoint can then be triggered by the controller at the time TE when the controller detects that the projected signal 145 crosses the threshold VT at time TE+ΔT. This is effectively equivalent to adjusting the threshold value.

In some implementations, the time delay value ΔT can be entered by a user. In some implementations, the time delay value ΔT can be calculated automatically by the controller 148 based on properties of the filter. For example, for an unweighted running average, the time delay value ΔT could be half of the time over which the raw values are averaged.

For a weighted running average, the time delay value ΔT could be similarly based on the weights. For example, a filtered value $\overline{x}$ could be calculated as:

$$\overline{x}_i = \sum_{k=0}^{N-1} a_k * x_{i-k}$$

where N is the number of consecutive values that are being averaged, and ax is the weight for each signal value from the series. In this case, the time delay value ΔT could be calculated as:

$$\Delta T = \frac{1}{f} * \frac{\sum_{k=0}^{N-1} k * a_k}{\sum_{k=0}^{N-1} a_k}$$

where f is the sampling rate (e.g., the frequency at which the raw values are generated, e.g., once per rotation of the platen).

In general, the time delay value can be determined based on the measurement frequency and order of the filter, with techniques that will be appropriate for individual filters.

In some embodiments, the user may input into the controller 148 the time period over which the filter will operate; in this case, the controller 148 can calculate the time delay value ΔT from this time period (e.g., half of the time period for an unweighted running average) and can calculate the number of values to use in the filter from the sampling rate. In some implementations, the user may input into the controller the number of values to use in the filter; in this case the controller 148 can calculate the time delay value ΔT from the number of values and the sampling rate.

The techniques described above can be performed either for values that have been converted to thickness measurements, or for values that are unconverted. For example, the controller 148 can include a function, e.g., a polynomial function or a look-up table, that will output a thickness value as a function of the measured value (e.g., a voltage value or % of possible signal strength). So the signal 640 shown in FIGS. 6 and 7 could be either a sequence of thickness values generated by converting the measured values to thickness values using the function, or a sequence of measured values that depend on the thickness but are not converted to actual thickness values.

In some embodiments, a slope R is calculated in the units of the measured value, and the slope R is then converted to a polishing rate in units of thickness. For example, if a polynomial function relating the thickness Y to the measurement X as $$Y = C0 + C1 * X + C2 * X^2$$

since R=dX/dt, the polishing rate dY/dt can be calculated as $$dY/dt = R^*(C1 + 2^*C2^*X)$$

Alternatively, in some embodiments, the filtered signal 640 can converted from measured values to thickness measurements for determination of the polishing rate (i.e., a function is fit to the thickness values rather than the values in the units of measurement).

The controller 148 may also be connected to the pressure mechanisms that control the pressure applied by carrier head 128, to carrier head rotation motor 136 to control the carrier head rotation rate, to the platen rotation motor 108 to control the platen rotation rate, or to slurry distribution system 120 to control the slurry composition supplied to the polishing pad. Specifically, after sorting the measurements into radial ranges, information on the layer thickness can be fed in real-time into a closed-loop controller to periodically or continuously modify the polishing pressure profile applied by a carrier head.

Nonetheless, it should be clear that thus far, the charts of adjusted thickness overtime (e.g., FIGS. 6 and 7) illustrate measurements when the substrate 130 is properly located between carrier head 128 and polishing pad 104. Surprisingly, the present disclosure has found that the monitoring system 146 can also be utilized to detect substrate slippage, and even provide a system alert, or even automatically end a polishing process.

Namely, referring back to FIGS. 6 and 7, filtered signal 640 declines in a generally linear manner. As noted, unfiltered signal 620 does contain small variations in signal between successive measurements. However, the variations in unfiltered signal between successive measurements generally account for a drop in signal strength V of about 20% or less, such as about 17.5% or less, such as about 15% or less, such as about 12.5% or less, such as about 10% or less, such as about 7.5% or less, such as about 5% or less.

Conversely, a substrate slippage even would result in a drop in signal strength between successive measurements of about 30% or more, such as about 40% or more, such as about 50% or more, such as about 60% or more, such as about 70% or more, such as about 80% or more, such as about 90% or more, up to 100% change in signal strength. Furthermore, substrate slippage can be detected by only a single sensor 154*a*. However, in some embodiments, such as when an automatic stoppage of polishing processes is initiated from the drop in signal strength, the change in signal strength may be confirmed by a second sensor 154*b*, a third sensor 154*c*, a fourth sensor 154*d*, a fifth sensor 154*e*, a sixth sensor 154*f*, or a combination thereof, prior to automatic termination of the polishing process.

Unlike the traditional optical sensors utilized in the art, the signal strength V measurements taken by sensors 154 can be utilized with opaque, reflective, and non-reflective surfaces. For instance, as the signal strength is based upon a substrate 130 thickness or thickness of one or more conductive layers thereof (or thickness between target 328), the slippage detection method herein can be used even when a surface of a substrate 130 is covered by a polishing liquid or otherwise. Furthermore, as the slippage detection method is measured in-situ and can be incorporated into a polishing module controller 148, stoppage of polishing can occur as soon as a significant drop in signal is obtained, or verified by one or more sensors 154, (e.g., automatically by controller 148). This allows the polishing process to be stopped almost immediately after slippage is detected, preventing substrate 130 and carrier head 128 damage.

In addition, the controller 148 can be programmed to divide the measurements from the monitoring system 146 from each sweep beneath the substrate 130 into a plurality of sampling zones, to calculate the radial position of each sampling zone, and to sort the measurements into radial ranges. However, "chattering"-inconsistent determination of the measurement positions from scan to scan—that causes both the leading and trailing edges of a trace shift forward and back in the time domain.

Thus, in some embodiments, either as an alternative or in addition to thickness monitoring via signal strength, a "pin location", calibrated by running a substrate with no head sweep, can be utilized to determine if a substrate is properly disposed under carrier 128. The pin location can be detected from the substrate edge signal's first derivative, which is not dependent on film profile. When this pin location is obtained, it is used to calculate real time head sweep and senses substrate location. This technique can reduce chattering significantly and allow a more accurate determination of the position of the sensor on the substrate. The sensor position can be calculated using sensor measurements from the polisher rather than relying on process parameter information (e.g., platen rotation rate) sent from polisher.

For instance, referring back to FIG. 1 as well as FIGS. 8-11, the signal from the in-situ monitoring system 146 can be monitored to detect a leading edge and a trailing edge of the substrate. Alternatively, the signal from the in-situ monitoring system 146 can be monitored to detect a leading edge and a trailing edge of the retaining ring 144, e.g., a leading edge and trailing edge of an inner surface 144*a* of the retaining ring 144, or a leading edge and trailing edge of an outer surface 144*b* of the retaining ring 144.

To detect the leading edge and trailing edge, the first derivative of the signal can be calculated and monitored. For example, the first derivative of the signal can be calculated and monitored for a peak (for the leading edge of the substrate or outer surface of the retaining ring) and a valley (for the trailing edge of the substrate or outer surface of the retaining ring). As another example, the first derivative of the signal can be calculated and monitored for a valley (for the leading edge of the inner surface of the retaining ring) and a peak (for the trailing edge of the inner surface of the retaining ring). The time at which the peak and valley occur indicates the time that the sensor crosses the leading edge and trailing edge, respectively.

Figure 9:
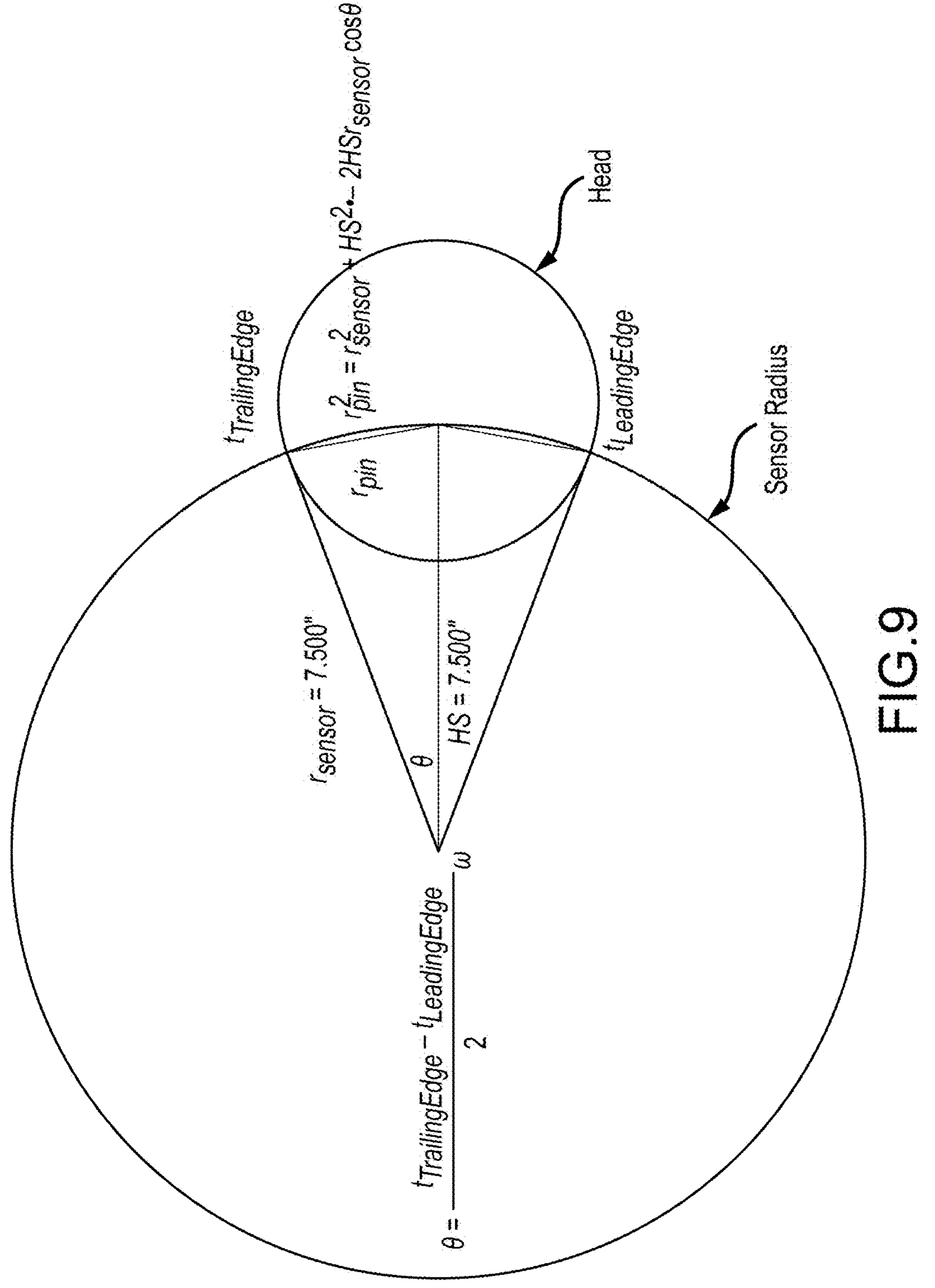
FIG. 9 is a schematic diagram illustrating the process for calculating a radial position of measurement.
Figure 10:
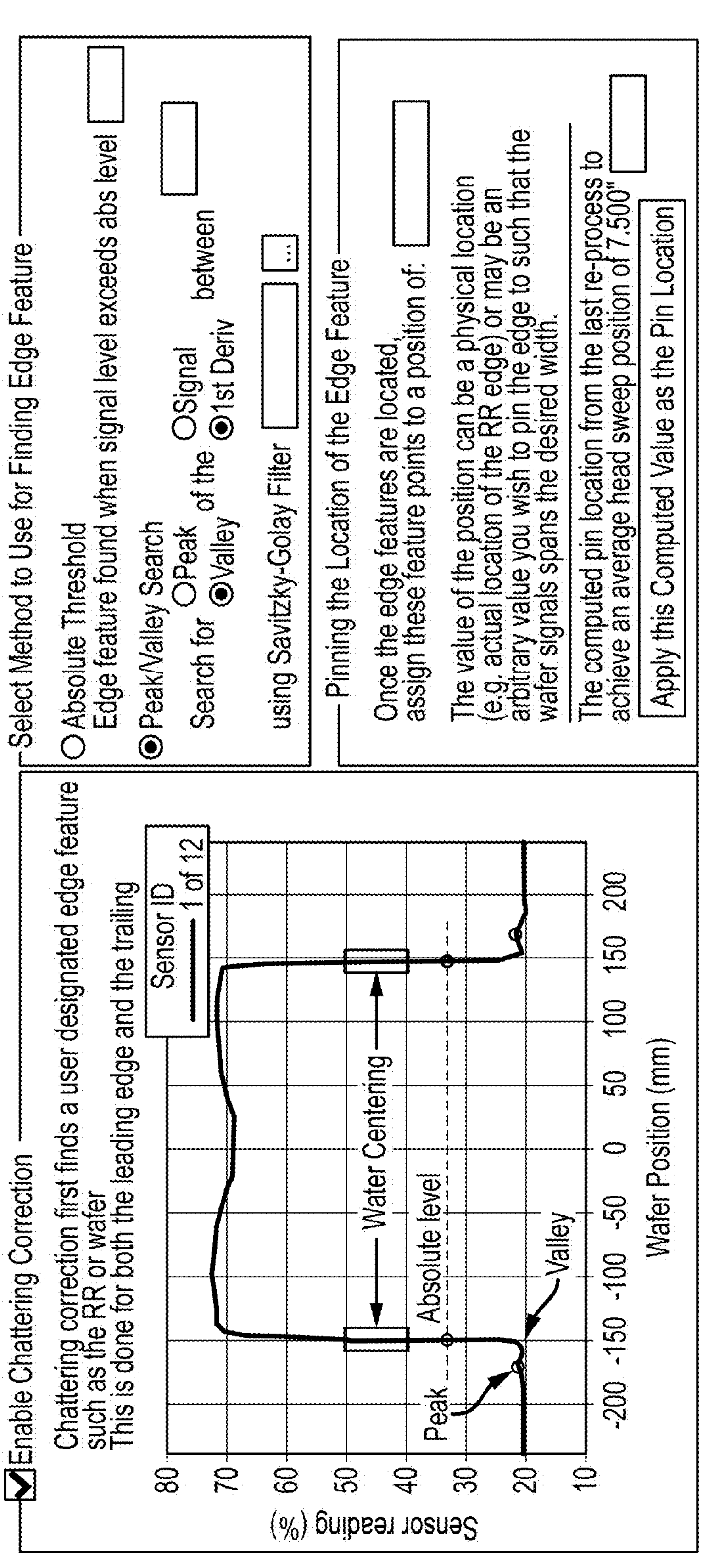
FIG. 10 includes a graph of a sensor reading (%) based upon wafer position (mm), and illustrates a graphical user interface to be displayed by a controller.

To calculate the radial position of the measurements, the polishing system can initially be run in a calibration mode in which the carrier head 128 is not laterally oscillated. Referring to FIG. 9, in this calibration run, the carrier head is positioned such that the center of the carrier head 128 is at the same radial distance from the axis of rotation of the platen 102 as the sensor.

The controller 148 detects, based on the received signal from the monitoring system 146, the time $t_{LE}$ ($t_{LeadingEdge}$ in FIG. 9) at which the sensor crosses a leading edge, and similarly detects the time $t_{TE}$ ($t_{TrailingEdge}$ in FIG. 9) at which the sensor crosses a trailing edge, as discussed above. The platen rotation rate, ω, can be calculated based on signals from the position sensor. Alternatively or in addition, ω is be taken from a control value stored in the controller.

Based on these values and the Law of Cosines, a radial position $r_{pin}$ of a "pin point" can be calculated using the following:

$$\theta = \frac{t_{TE} - t_{LE}}{2}\omega$$

$$r_{pin}^2 = HS^2 + r_{sensor}^2 - 2HSr_{sensor}\cos\theta$$

where HS is the head sweep position (the distance between the axis of rotation of the platen 102 and the center axis 138 of the carrier head) and $r_{sensor}$ is a known distance between the sensor and the axis of rotation of the platen. Here the term "pin point" indicates a set point on the edge, e.g., the edge of the substrate or inner or outer surface of the retaining ring.

In subsequent monitoring steps, positions of measurements can be calculated based on the position of the pin point. If a retaining ring edge is being used as the pin point, the substrate can be absent during the calibration. An exemplary value for both HS and $r_{sensor}$ during the calibration run is 7.5 inches.

Figure 11:
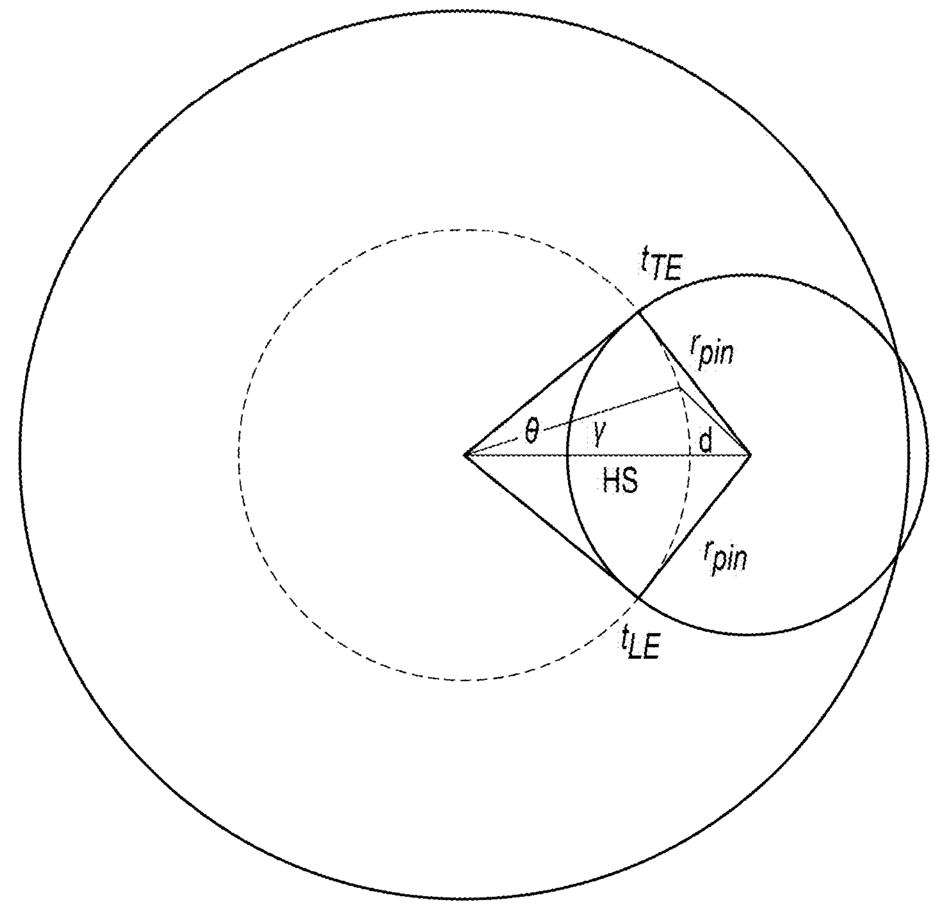
FIG. 11 is a schematic diagram illustrating calculation of the position of the measurement (in terms of radial distance from the center of the substrate).

Referring to FIG. 11, for polishing of substrates, the polishing system can initially be run in a normal mode in which the carrier head 128 does laterally oscillate and the substrate 130 is monitored with the in-situ monitoring system 146. In this mode, the head sweep position HS can be calculated on a sweep-by-sweep basis. That is, for each sweep, times $t_{LE}$ and $t_{TE}$ are determined based on the signal from the eddy current monitoring system. The head sweep position HS can be calculated from @, $t_{LE}$, $t_{TE}$, $I_{pin}$ and $r_{sensor}$ using the above and the following equations with a=1:

$$b = -2r_{sensor}\cos\theta$$

$$c = r_{sensor}^2 - r_{pin}^2$$

$$HS = \frac{-b \pm \sqrt{b^2 - 4ac}}{2a}$$

The position of each measurement from the in-situ monitoring system, i.e., the radial distance d of the measurement from the center of the substrate, can then be calculated on a measurement-by-measurement basis from HS, ω, $t_{LE}$, $t_{TE}$, and $r_{sensor}$ and the particular time $t_{flash}$ at which the measurement occurs (real time) using the following equations:

$$\gamma = \left[t_{flash} - \frac{t_{TE} - t_{LE}}{2}\right]\omega$$

$$d^2 = HS^2 + r_{sensor}^2 - 2HSr_{sensor}\cos\gamma$$

γ represents the angle between the sensor and the line connecting the center of the platen 102 and the center 138 of the carrier head 128 at the time of the measurement. Again, the platen rotation rate, ω, can be calculated based on signals from the position sensor. Alternatively or additionally, ω can be taken from a control value stored in the controller.

By using a location of the pin point and geometrical calculation of the sensor location on the substrate, the actual locations (e.g., radial positions relative to the center of the substrate) of measurements can be determined more accurately, and consequently chattering can be reduced. This enables improved scan-to-scan and senor-to-sensor matching. As a result, endpoint determination can be made more reliable and/or wafer uniformity can be improved.

Furthermore, as noted above, it was surprisingly found that the pin point calculation can be used to determine a substrate slippage event. Namely, as may be clear from the above description, the pin point calculation requires the detection of a leading and trailing edge of substrate 130. Thus, in some aspects, a method to automatically terminate a polishing process can be based fully or in part on a substrate chattering correction or substrate centering correction failure due to no substrate edge being located for a pin point calculation of the like. For instance, such a failure would result in no centering and/or no edge detection unlike the centered location of FIG. 10. Unlike the traditional optical sensors utilized in the art, the substrate chattering determination can be utilized with opaque, reflective, and non-reflective surfaces.

For instance, as the chattering values are based upon a conductive material at the leading and trailing edge of the substrate, the slippage detection method herein can be used even when a surface of a substrate 130 is covered by a polishing liquid or otherwise. Furthermore, as the slippage detection method is measured in-situ and can be incorporated into a polishing module controller 148, stoppage of polishing can occur as soon as one or more edges cannot be located, a substrate cannot be centered, or a combination thereof, or where such parameters are verified by one or more sensors 154, (e.g., automatically by controller 148). This allows the polishing process to be stopped almost immediately after slippage is detected, preventing substrate 130 and carrier head 128 damage. Furthermore, it should be clarified that the method discussed herein utilizes measurement of a leading and trailing edge of substrate 130, as determination based upon the leading and trailing edge of carrier ring 144 of carrier head 128 would fail to detect a substrate slippage event.

Nonetheless, as noted above, in some embodiments, both a signal strength method and an edge detection method may be utilized together to provide additional redundancy in slippage detection. However, it should be understood that, in some embodiments, either a signal strength method or an edge detection method may be adequate for detecting substrate slippage.

The in-situ monitoring system 146 can be used in a variety of polishing systems. Either the polishing pad, or the carrier head, or both can move to provide relative motion between the polishing surface and the substrate. The polishing pad can be a circular (or some other shape) pad secured to the platen, a tape extending between supply and take-up rollers, or a continuous belt. The polishing pad can be affixed on a platen, incrementally advanced over a platen between polishing operations, or driven continuously over the platen during polishing. The pad can be secured to the platen during polishing, or there can be a fluid bearing between the platen and polishing pad during polishing. The polishing pad can be a standard (e.g., polyurethane with or without fillers) rough pad, a soft pad, or a fixed-abrasive pad.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

As used herein and in the appended claims, the singular forms “a”, “an”, and “the” include plural references unless the context clearly dictates otherwise. Thus, for example, reference to “a heater” includes a plurality of such heaters, and reference to “the protrusion” includes reference to one or more protrusions and equivalents thereof known to those skilled in the art, and so forth.

As used herein, the terms “about” or “approximately” or “substantially” may be interpreted as being within a range that would be expected by one having ordinary skill in the art in light of the specification.

Also, the words “comprise(s)”, “comprising”, “contain(s)”, “containing”, “include(s)”, and “including”, when used in this specification and in the following claims, are intended to specify the presence of stated features, integers, components, or operations, but they do not preclude the presence or addition of one or more other features, integers, components, operations, acts, or groups.

The term “computer-readable medium” includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMS, EPROMS, EEPROMs, magnetic or optical cards, flash memory, or other types of machine-readable mediums suitable for storing electronic instructions. Alternatively, the methods may be performed by a combination of hardware and software.

What is claimed is:

1. A method of detecting substrate slippage, comprising:

bringing a surface of a layer of a substrate into contact with a polishing pad;

causing relative motion between the substrate and the polishing pad;

sweeping a first sensor and a second sensor of a plurality of sensors of an in-situ monitoring system across the substrate as the layer of the substrate undergoes polishing with a rotatable platen;

generating, from the in-situ monitoring system, a first sequence of signal values from the first sensor and a second sequence of signal values from the second sensor, wherein the first sequence of signal values and the second sequence of signal values include a signal strength relative to a thickness of the layer;

detecting, from the first sequence of signal values from the first sensor of the in-situ monitoring system, a time that the first sensor traverses a leading edge of the substrate and a time that the first sensor traverses a trailing edge of the substrate;

detecting, from the second sequence of signal values from the second sensor of the in-situ monitoring system, a second time that the second sensor traverses a leading edge of the substrate and a second time that the second sensor traverses the trailing edge of the substrate;

for each signal value of at least some of the first sequence of signal values, determining a position on the substrate for the signal value based on the time that the first sensor traverses the leading edge of the substrate and the time that the first sensor traverses the trailing edge of the substrate;

for each second signal value of at least some of the second sequence of signal values, determining a position on the substrate for the second signal value based on the time that the second sensor traverses the leading edge of the substrate and the time that the second sensor traverses the trailing edge of the substrate; and activating a slippage alert if: the signal strength varies by 30% or more from the first sequence of signal values to the second sequence of signal values, a position on the substrate for the second signal value cannot be determined, or a combination thereof.

2. The method of claim 1, wherein determining the position comprises:

determining a first derivative of the first sequence of signal values; and identifying a valley and a peak in the first derivative.

3. The method of claim 1, further comprising a third sequence of signal values from a third sensor of the plurality of sensors, wherein the third sensor is disposed between the first sensor and the second sensor.

4. The method of claim 3, wherein the slippage alert is only activated if the signal strength varies by 30% or more from both the first sequence of signal values to the third sequence of signal values and the third sequence of signal values to the second sequence of signal values, a position on the substrate for the second sequence of signal values and the third sequence of signal values cannot be determined, or a combination thereof.

5. The method of claim 3, wherein the slippage alert halts the relative motion when activated.

6. The method of claim 5, wherein the relative motion is halted by a controller.

7. The method of claim 1, wherein detecting the signal values comprises detecting a conductive layer within the leading edge and a trailing edge of the substrate.

8. A non-transitory computer-readable medium having tangibly encoded therein a computer program comprising instructions to cause a computer system to:

receive, a first sequence of signal values from a first sensor of an in-situ monitoring system and a second sequence of signal values from a second sensor of the in-situ monitoring system, wherein the first sequence of signal values and the second sequence of signal values include a signal strength relative to a thickness of a layer of a substrate, wherein the first sensor and second sensor sweep across and monitor the substrate during polishing when a surface of a layer of the substrate is in contact with a polishing pad, and polishing includes relative motion between the substrate and the polishing pad;

detect, from the first sequence of signal values from the first sensor of the in-situ monitoring system, a time that the first sensor traverses a leading edge of the substrate and a time that the first sensor traverses a trailing edge of the substrate;

detect, from the second sequence of signal values from the second sensor of the in-situ monitoring system, a second time that the second sensor traverses the leading edge of the substrate and a second time that the second sensor traverses the trailing edge of the substrate;

for each signal value of at least some of the first sequence of signal values, determine a position on the substrate for the signal value based on the time that the first sensor traverses the leading edge of the substrate and the time that the first sensor traverses a trailing edge of the substrate;

for each second signal value of at least some of the second sequence of signal values, determine a position on the substrate for the second signal value based on the time that the second sensor traverses the leading edge of the substrate and the time that the second sensor traverses the trailing edge of the substrate; and activate a slippage alert if: the signal strength varies by 30% or more from the first sequence of signal values to the second sequence of signal values, a position on the substrate for the second signal value cannot be determined, or a combination thereof.

9. The non-transitory computer-readable medium of claim 8, wherein the instructions cause polishing to cease if the slippage alert is activated.

10. The non-transitory computer-readable medium of claim 9, wherein the computer system automatically ceases the polishing.

11. The non-transitory computer-readable medium of claim 9, comprising instructions to cause a computer system to:

receive, a third sequence of signal values from a third sensor of the in-situ monitoring system that include a signal strength relative to the thickness of the layer, wherein the third sensor is disposed circumferentially between the first sensor and the second sensor, wherein the slippage alert is only activated if the signal strength varies by 30% or more from both the first sequence of signal values to the third sequence of signal values and the third sequence of signal values to the second sequence of signal values, a position on the substrate for the second sequence of signal values and the third sequence of signal values cannot be determined, or a combination thereof.

12. The non-transitory computer-readable medium of claim 8, wherein the instructions to determine the position of the signal value on the substrate include instructions to determine a distance of a center of a carrier head holding the substrate from an axis of rotation of a rotatable platen based on the time that the first sensor traverses the leading edge and the time that the first sensor traverses the trailing edge, and to determine the position on the substrate for the first sequence of signal values based on the distance.

* * * * *